US012713601B2

(12) United States Patent
Lee et al.

(10) Patent No.: US 12,713,601 B2

(45) Date of Patent: Aug. 18, 2026

(54) SEMICONDUCTOR MEMORY DEVICE AND MANUFACTURING METHOD OF THE SEMICONDUCTOR MEMORY DEVICE

(71) Applicant: SK hynix Inc., Icheon-si Gyeonggi-do (KR)

(72) Inventors: Jae Min Lee, Icheon-si Gyeonggi-do (KR); Jae Ho Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 649 days.

(21) Appl. No.: 18/097,903

(22) Filed: Jan. 17, 2023

(65) Prior Publication Data

US 2024/0023331 A1 Jan. 18, 2024

(30) Foreign Application Priority Data

Jul. 18, 2022 (KR) ........................ 10-2022-0088455

(51) Int. Cl.

*H10B 43/27* (2023.01)
*H10B 41/27* (2023.01)
*H10B 41/41* (2023.01)
*H10B 43/40* (2023.01)

(52) U.S. Cl.

CPC ............. *H10B 43/27* (2023.02); *H10B 41/27* (2023.02); *H10B 41/41* (2023.02); *H10B 43/40* (2023.02)

(58) Field of Classification Search

CPC ........ H10B 43/27; H10B 41/27; H10B 41/41; H10B 43/40; H10B 43/50; H10B 43/10; H10B 41/50; H10B 41/30; H10B 43/30

See application file for complete search history.

(56) References Cited

U.S. PATENT DOCUMENTS

2017/0338241 A1* 11/2017 Lee ........................ H10B 43/35
2020/0273881 A1* 8/2020 Kim .................... H01L 23/5226
2020/0381447 A1* 12/2020 Kim ........................ H10B 43/27
2021/0134832 A1* 5/2021 Choi ................. H01L 21/76895
2021/0358943 A1* 11/2021 Lee ........................ H10B 43/40

FOREIGN PATENT DOCUMENTS

KR 1020200073702 A 6/2020
KR 1020200133557 A 11/2020
KR 1020220071553 A 5/2022

* cited by examiner

*Primary Examiner* — Andres Munoz

(74) *Attorney, Agent, or Firm* — WILLIAM PARK AND ASSOCIATES LTD.

(57) ABSTRACT

A semiconductor memory device including a substrate also includes a source stack and a preliminary source stack spaced apart from each other and arranged over the substrate. The semiconductor memory device additionally includes a conductive contact plug passing through the source stack and a charge dispersion layer passing through a portion of the preliminary source stack.

11 Claims, 13 Drawing Sheets

FIG. 2

SI
SP1
SP2
CDL1
PCT_L
SWL_L
pSL
CDL2
II'
I'
II
I
CTR
SI
SL
DCC
CER
BLK

FIG. 5C 100 109 107 105 103 101 P4 LIL PC SUB Jn2 ACT1 Jn1 ISO ACT1 115 113 131 151 LIL ISO ACT2 DCI 100 P4 P3 P2 P1 SUB

FIG. 5D

FIG. 5E 210
251
133
113
117
SUB
Jn2
ACT1
Jn1
ISO
ACT1
100
241
239
237
235
233
231
211
213
...
213
211
109
107
105
103
101
153
P4
P3
P2
P1
SUB
DCI
ACT2
ISO
210
100
160

Figure 5G:
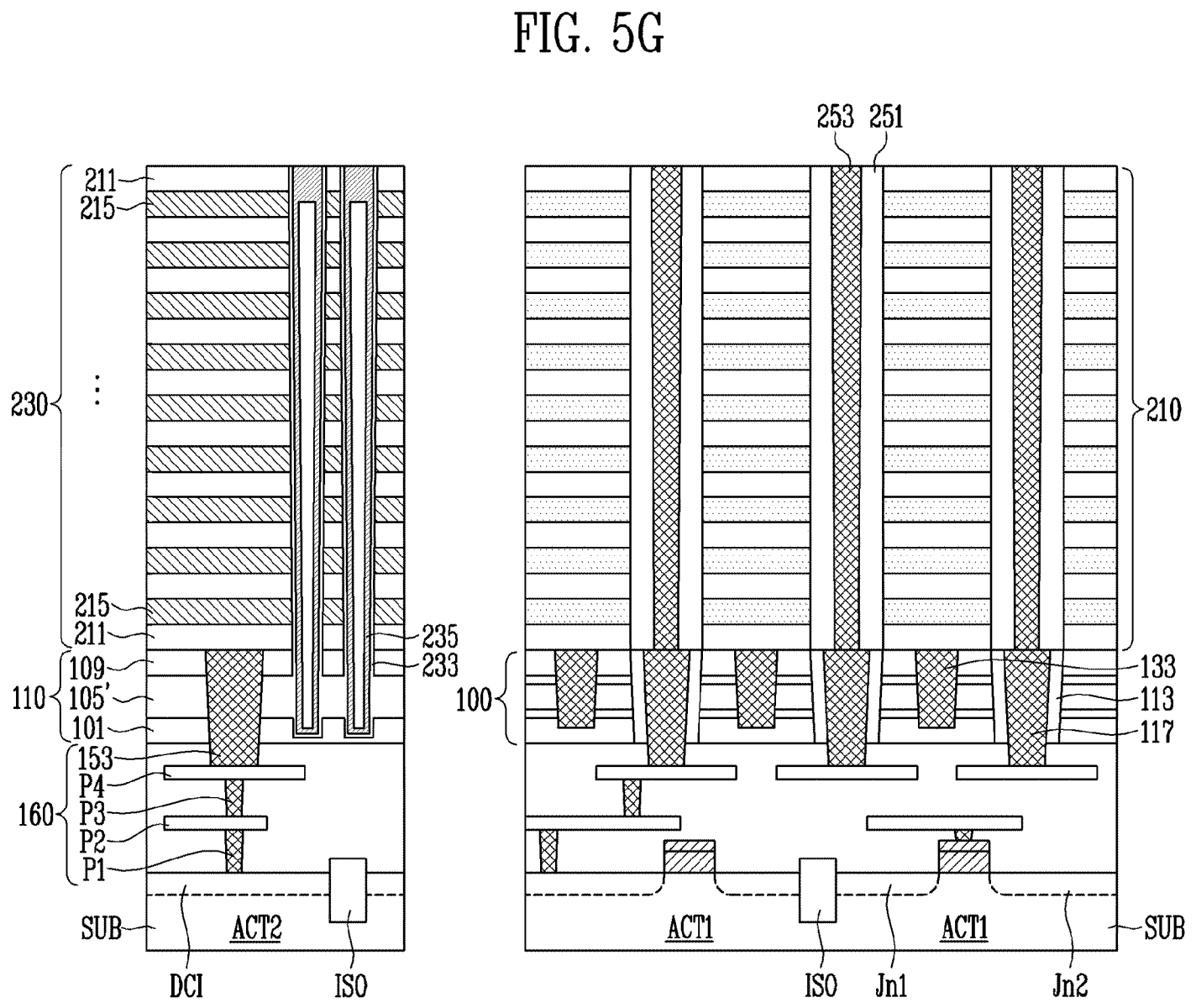

FIG. 5G 210
133
113
117
SUB
253
251
Jn2
ACT1
Jn1
ISO
ACT1
100
235
233
ISO
ACT2
DCI
SUB
211
215
...
215
211
109
105'
101
153
P4
P3
P2
P1
230
110
160

SEMICONDUCTOR MEMORY DEVICE AND MANUFACTURING METHOD OF THE SEMICONDUCTOR MEMORY DEVICE

CROSS-REFERENCE TO RELATED APPLICATION

The present application claims priority under 35 U.S.C. § 119(a) to Korean patent application number 10-2022-0088455 filed on Jul. 18, 2022, in the Korean Intellectual Property Office, the entire disclosure of which is incorporated by reference herein.

BACKGROUND

1. Technical Field

Various embodiments the present disclosure relate to a semiconductor memory device and a method of manufacturing the same, and more particularly, to a three-dimensional semiconductor memory device and a method of manufacturing the same.

2. Related Art

In general, a non-volatile memory device electrically erases and programs data and retains the data even in the absence of power supply. Recently, the use of non-volatile memory devices has been increasing in various fields.

Non-volatile memory devices include memory cell transistors in various forms and are classified as NAND type and NOR type memory devices according to cell array structures. These two types of non-volatile memory devices have their ow n advantages and disadvantages.

More specifically, a NAND type non-volatile memory device has an advantage in high integration because it has a cell string structure in which a plurality of memory cell transistors are coupled in series with each other. In addition, a NAND type non-volatile memory device adopts an operating scheme by which information stored in a plurality of memory cell transistors is changed at the same time. Therefore, an information update speed of the NAND type non-volatile memory device is much faster than that of the NOR type non-volatile memory device. Because of their high integration and fast update speed, as indicated above, NAND type non-volatile memory devices are used mainly in portable electronic products requiring mass storage, such as digital cameras and MP3 players.

Research and development is being conducted to promote and highlight the advantages of NAND type non-volatile memory devices. Accordingly, three-dimensionally structured NAND non-volatile memory devices have been developed.

SUMMARY

According to an embodiment of the present disclosure, a semiconductor memory device may include a substrate, a source stack and a preliminary source stack spaced apart from each other and arranged over the substrate, a conductive contact plug passing through the source stack, and a charge dispersion layer passing through a portion of the preliminary source stack.

According to an embodiment of the present disclosure, a semiconductor memory device may include a substrate; a first source layer on the substrate; a preliminary second source layer and a second source layer arranged over the first source layer; a third source layer including a first region overlapping the preliminary second source layer and a second region overlapping the second source layer; a lower sidewall insulating layer passing through the first source layer, the preliminary second source layer, and the first region of the third source layer; a plurality of charge dispersion layers spaced apart from the lower sidewall insulating layer and passing through the preliminary second source layer and the first region of the third source layer; a conductive contact plug passing through the first source layer, the second source layer, and the second region of the third source layer; a cell stack over the second region of the third source layer; and a channel structure passing through the cell stack and the second region of the third source layer and connected to the preliminary second source layer.

BRIEF DESCRIPTION OF THE DRAWINGS

FIG. 2 is a plan view illustrating a memory block according to embodiment of the present disclosure;

FIGS. 5A, 5B, 5C, 5D, 5E, 5F and 5G are cross-sectional views illustrating a method of manufacturing a memory cell array according to an embodiment of the present disclosure;

DETAILED DESCRIPTION

Specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various embodiments are directed to a semiconductor memory device with improved operational reliability.

While terms such as "first" and "second" may be used to describe various components, such components should not be understood as being limited to the above terms. The above terms are used only to distinguish one component from another and not to imply an order or number of components. For example, a first component may be referred to as a second component without departing from the scope of rights of the present disclosure, and likewise a second component may be referred to as a first component.

Figure 1:
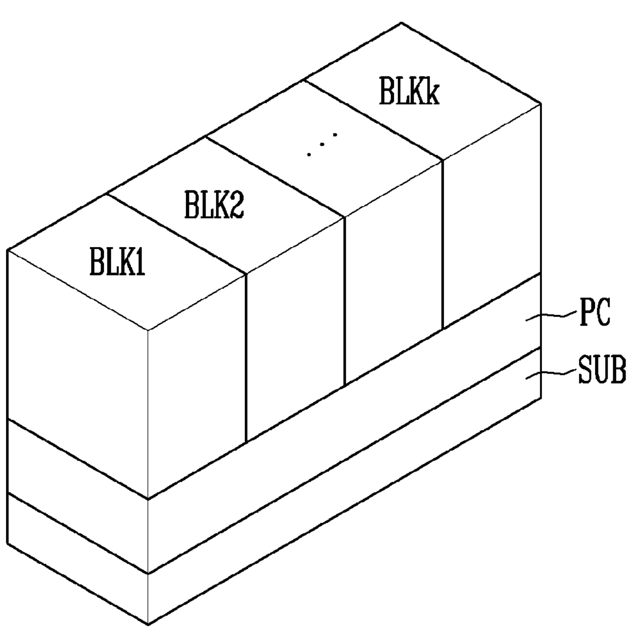
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device may include a peripheral circuit structure PC and memory blocks BLK1 to BLKk which are arranged on a substrate SUB. The memory blocks BLK1 to BLKk may overlap the peripheral circuit structure PC.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by using a selective epitaxial growth technique.

The peripheral circuit structure PC may include a row decoder, a column decoder, a page buffer, and a control circuit which constitute a circuit for controlling operations of the memory blocks BLK1 to BLKk. For example, the peripheral circuit structure PC may include an NMOS transistor, a PMOS transistor, a resistor, and a capacitor which are electrically coupled to the memory blocks BLK1 to BLKk. The peripheral circuit structure PC may be arranged between the substrate SUB and the memory blocks BLK1 to BLKk.

Each of the memory blocks BLK1 to BLKk may include a source structure, bit lines, cell strings electrically coupled to the source structure and the bit lines, word lines electrically coupled to the cell strings, and select lines electrically coupled to the cell strings. Each of the cell strings may include memory cells and select transistors which are coupled in series with each other by a channel structure. Each of the select lines may serve as a gate electrode of a corresponding one of the select transistors. Each of the word lines may serve as a gate electrode of a corresponding one of the memory cells.

According to another embodiment, the substrate SUB, the peripheral circuit structure PC, and the memory blocks BLK1 to BLKk may be stacked in reverse order to the order shown in FIG. 1. As a result, the peripheral circuit structure PC may be arranged on the memory blocks BLK1 to BLKk.

Figure 2:
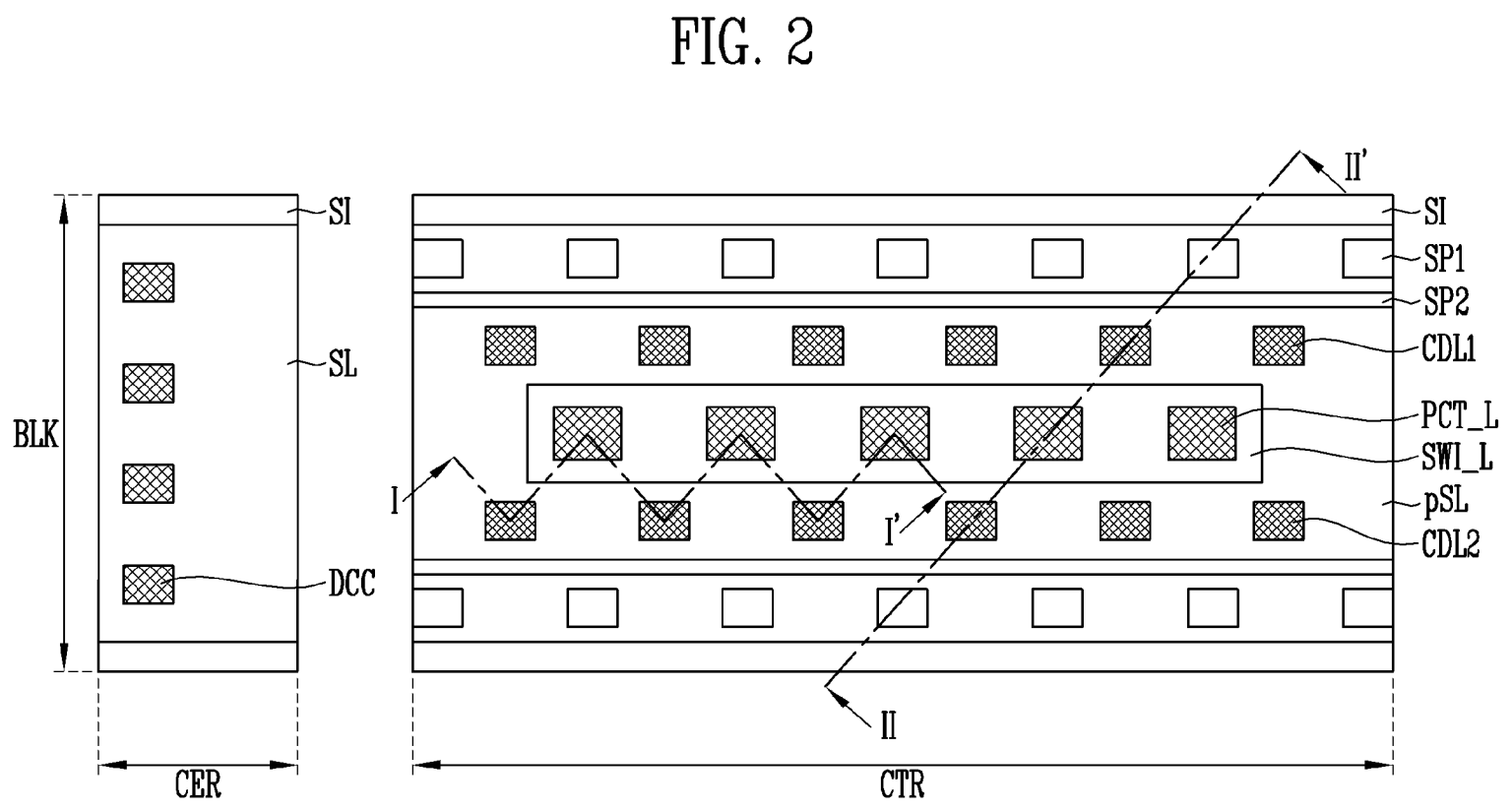

FIG. 2 is a plan view illustrating a memory block BLK according to embodiment of the present disclosure.

Referring to FIG. 2, the memory block BLK may include a preliminary source stack pSL and a plurality of charge dispersion layers CLD1 and CLD2 which pass through a portion of the preliminary source stack pSL in a contact region CTR. The memory block BLK may include a source stack SL and a plurality of conductive contact plugs DCC which pass through the source stack SL in a cell region CER. Though not shown in FIG. 2, the plurality of conductive contact plugs DCC may be included in the contact region CTR as well as in the cell region CER.

The plurality of charge dispersion layers CDL1 and CDL2 may include a plurality of first charge dispersion layers CDL1 and a plurality of second charge dispersion layers CDL2 which are arranged at both sides of a lower sidewall insulating layer SWI_L. The plurality of charge dispersion layers CDL1 and CLD2 may be spaced apart from the lower sidewall insulating layer SWI_L.

The memory block ELK may include the lower sidewall insulating layer SWI_L which passes through the preliminary source stack pSL, a plurality of lower peripheral contact plugs PCT_L which pass through the lower sidewall insulating layer SWI_L, a plurality of first supports SP1, and a second support SP2. However, the first supports SP1 and the second support SP2 are not limited to the configuration shown in FIG. 2 and may have various configurations.

According to an embodiment, the plurality of charge dispersion layers CDL1 and CDL2 and a plurality of lower peripheral contact plugs PCT_L may be arranged in a zigzag pattern. The arrangements of the plurality of charge dispersion layers CDL1 and CDL2 and the plurality of lower peripheral contact plugs PCT_L are not limited to those shown in FIG. 2.

The lower sidewall insulating layer SWI_L may block a flow of current from the preliminary source stack pSL and the source stack SL to the lower peripheral contact plug PCT_L. The plurality of first supports SP1 and the second support SP2 may block an etching material from being introduced into a region where the lower peripheral contact plugs PCT_L are arranged during the manufacturing processes of the semiconductor memory device.

Figure 3:
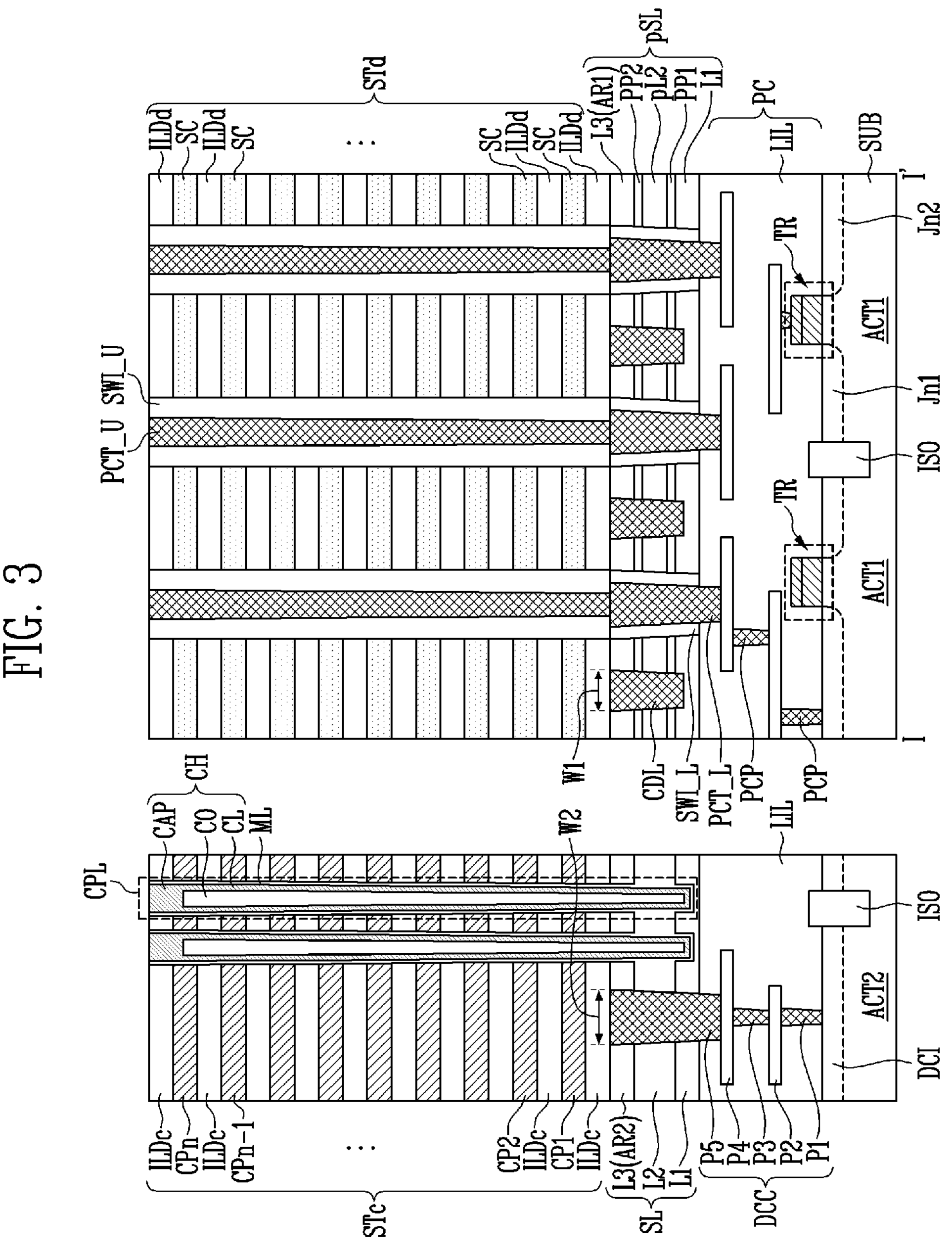
FIG. 3 is a cross-sectional diagram illustrating a semiconductor memory device taken along line I-I' of FIG. 2.

FIG. 3 is a cross-sectional diagram illustrating a semiconductor memory device taken along line I-I' of FIG. 2.

Referring to FIG. 3, according to an embodiment of the present disclosure, the semiconductor memory device may include the source stack SL which is arranged over the substrate SUB, the preliminary source stack pSL, a cell stack STc which is arranged over the source stack SL, a dummy stack STd which is arranged over the preliminary source stack pSL, the conductive contact plugs DCC which pass through the source stack SL overlapped by the cell stack STc, the lower sidewall insulating layer SWI_L which passes through the preliminary source stack pSL overlapping the dummy stack STd, and a charge dispersion layer CDL which passes through a portion of the preliminary source stack pSL.

The substrate SUB may include the same material as the substrate SUB as described above with reference to FIG. 1. Conductivity type dopants which define a well region may be injected into the substrate SUB. The conductivity type dopants which define the well region may be n-type or p-type impurities. The well region of the substrate SUB may be divided into active regions ACT1 and ACT2 which are partitioned by isolation layers ISO. The isolation layers ISO may include an insulating material which is buried in the substrate SUB. The active regions ACT1 and ACT2 may include at least one first active region ACT1 which is overlapped by the dummy stack STd and a second active region ACT2 which is overlapped by the conductive contact plug DCC.

The source stack SL and the preliminary source stack pSL may be separated from the substrate SUB by the peripheral circuit structure PC and a lower insulation structure LIL.

The peripheral circuit structure PC may include a transistor TR as described above with reference to FIG. 1. The transistor TR may include a peripheral-gate insulating layer which is arranged over the first active region ACT1, a peripheral-gate electrode which is arranged over the peripheral-gate insulating layer, and first and second junctions Jn1 and Jn2 which are disposed in the first active region ACT1 at both sides of the peripheral-gate electrode. The first and second junctions Jn1 and Jn2 may be defined by injecting n-type or p-type impurities into the first active region ACT1. One of the junctions may serve as a source junction and the other may serve as a drain junction.

Conductive impurities may be injected into the second active region ACT2. According to an embodiment, a discharge impurity region DCI may be defined in the second active region ACT2. The discharge impurity region DCI may include conductive impurities which form a PN diode. The discharge impurity region DCI may be used as a path for discharging charges accumulated in the source stack SL.

The peripheral circuit structure PC may be covered by the lower insulation structure LIL which is disposed between the source stack SL and the preliminary source stack pSL and the substrate SUB. The lower insulation structure LIL may extend to cover the discharge impurity region DCI. The lower insulation structure LIL may include a plurality of insulating layers which are stacked on top of each other.

The source stack SL may be arranged over the lower insulation structure LIL. The source stack SL may include first, second, and third source layers L1, L2, and L3 which are stacked sequentially over the lower insulation structure LIL. Each of the first and second source layers L1 and L2 may be a doped semiconductor layer which includes a source dopant. According to an embodiment, each of the first and second source layers L1 and L2 may include a doped silicon layer which includes n-type impurities. The third source layer L3 may include a first area AR1 which is overlapped by the dummy stack STd and a second area AR2 which overlaps the cell stack Sic. The third source layer L3 may not be formed in some cases. The third source layer L3 may include at least one of an n-type doped semiconductor layer and an undoped semiconductor layer.

The source stack SL may be penetrated by the conductive contact plug DCC. The conductive contact plug DCC may pass through the lower insulation structure LIL to contact the discharge impurity region DCI of the substrate SUB. The conductive contact plug DCC may directly contact the discharge impurity region DCI and the source stack SL. The source stack SL and the discharge impurity region DCI may be coupled to each other by the conductive contact plug DCC. Therefore, the charges accumulated in the source stack SL may be discharged to the substrate SUB through the discharge impurity region DCI via the conductive contact plug DCC.

The conductive contact plug DCC may include first to fifth patterns P1 to P5 which are stacked on each other in a sequential manner. The first pattern P1 and the third pattern P3 may be disposed in the lower insulation structure LIL and arranged at respective levels where peripheral-contact plugs PCP are arranged. The second pattern P2 and the fourth pattern P4 may be disposed in the lower insulation structure LIL and arranged respectively at levels where coupling wires are arranged. The fifth pattern P5 may extend into the lower insulation structure LIL to pass through the source stack SL and contact the fourth pattern P4.

The preliminary source stack pSL may be arranged over the lower insulation structure LIL. The preliminary source stack pSL may include the first source layer L1, a preliminary second source layer pL2, and the third source layer L3. The preliminary source stack pSL may include a first protective layer PP1 which is arranged between the first source layer L1 and the preliminary second source layer pL2, and a second protective layer PP2 which is arranged between the preliminary second source layer pL2 and the third source layer L3. The preliminary source stack pSL may be arranged at the same level as the source stack SL.

The preliminary source stack pSL may be penetrated by the lower sidewall insulating layer SWI_L, and the lower peripheral contact plug PCT_L, and may be partially penetrated by the charge dispersion layer CDL.

The lower peripheral contact plug PCT_L may be surrounded by the lower sidewall insulating layer SWI_L. The lower peripheral contact plug PCT_L may pass through the lower insulation structure LIL to contact the peripheral-gate electrode of the peripheral circuit structure PC. Therefore, the lower peripheral contact plug PCT_L may be separated from the preliminary source stack pSL by the lower sidewall insulating layer SWI_L.

The charge dispersion layer CDL may pass through a portion of the preliminary source stack pSL. The first source layer L1, the preliminary second source layer pL2, and the third source layer L3 of the preliminary source stack pSL may be coupled in parallel with each other by the charge dispersion layer CDL. The charge dispersion layer CDL may disperse charges, which are accumulated mainly in the third source layers L3 which are upper layers of the source stack SL and the preliminary source stack pSL, into the entire source stack SL and the entire preliminary source stack pSL. As a result, charge movements may be increased and resistance may be reduced, thereby improving operational reliability.

The charge dispersion layer CDL may be spaced apart from the conductive contact plug DCC. The charge dispersion layer CDL may be coupled to the discharge impurity region DCI via the first source layer L1 and the conductive contact plug DCC. Therefore, the charge dispersion layer CDL may improve the release of charges from the conductive contact plug DCC to the substrate SUB.

The cell stack STc may overlap the conductive contact plug DCC. The cell stack STc may include cell interlayer insulating layers ILDc and conductive patterns CP1 to CPn which are stacked alternately with each other over the source stack SL, where n is a natural number of 2 or more.

The dummy stack STd may include dummy insulating layers ILDd and sacrificial insulating layers SC which are stacked alternately with each other over the preliminary source stack pSL. The dummy stack STd may be arranged at the same level as the cell stack STc. The dummy insulating layers ILDd may be arranged at the same levels as the cell interlayer insulating layers ILDc, and the sacrificial insulating layers SC may be arranged at the same levels as the conductive patterns CP1 to CPn.

The cell interlayer insulating layers ILDc and the dummy insulating layers ILDd may include the same material and be formed by the same process. The sacrificial insulating layers SC may include a material having a different etch rate from the cell interlayer insulating layers ILDc and the dummy insulating layers ILDd. For example, the cell interlayer insulating layers ILDc and the dummy insulating layers ILDd may include a silicon oxide, and the sacrificial insulating layers SC may include a silicon nitride.

Each of the conductive patterns CP1 to CPn may include various conductive materials such as a doped silicon layer, a metal layer, or a metal silicide layer. Each of the conductive patterns CP1 to CPn may further include a barrier layer. For example, the conductive patterns CP1 to CPn may include two or more types of conductive materials. For example, each of the conductive patterns CP1 to CPn may include tungsten and a titanium nitride (TiN) layer which surrounds the surface of tungsten. Tungsten is a low-resistance metal and may reduce the resistance of the conductive patterns CP1 to CPn. The titanium nitride (TiN) layer may be a barrier layer and prevent a direct contact between tungsten and the cell interlayer insulating layers ILDc.

The conductive patterns CP1 to CPn may serve as gate electrodes of a cell string. The gate electrodes of the cell string may include source select lines, word lines, and drain select lines. The source select lines may serve as gate electrodes of source select transistors. The drain select lines may serve as gate electrodes of drain select transistors. The word lines may serve as gate electrodes of memory cells.

The cell stack STc may surround a channel structure CH. In other words, the channel structure CH may pass through the cell stack STc. A central region of the channel structure CH may be filled with a core insulating layer CO. A sidewall of the channel structure CH may be surrounded by a memory layer ML. The channel structure CH may be coupled to the source stack SL using various methods. The channel structure CH may pass through the cell stack STc and extend into the source stack SL. A sidewall of the channel structure CH which overlaps the source stack SL may directly contact the source stack SL. According to an embodiment, as shown in FIG. 3, the second source layer L2 of the source stack SL may directly contact a sidewall of a channel layer CL which overlaps the second source layer L2.

The dummy stack STd may surround an upper peripheral contact plug PCT_U and an upper sidewall insulating layer SWI_U. In other words, the upper peripheral contact plug PCT_U and the upper sidewall insulating layer SWI_U may pass through the dummy stack STd. The upper peripheral contact plug PCT_U may pass through the dummy stack STd and overlap the lower peripheral contact plug PCT_L. The upper sidewall insulating layer SWI_U may surround the upper peripheral contact plug PCT_U. In other words, the upper sidewall insulating layer SWI_U may be arranged between the dummy stack STd and the upper peripheral contact plug PCT_U. The upper sidewall insulating layer SWI_U may pass through the dummy stack STd and overlap the lower sidewall insulating layer SWI_L. The upper sidewall insulating layer SWI_U may include the same material as the lower sidewall insulating layer SWI_L.

Figure 4:
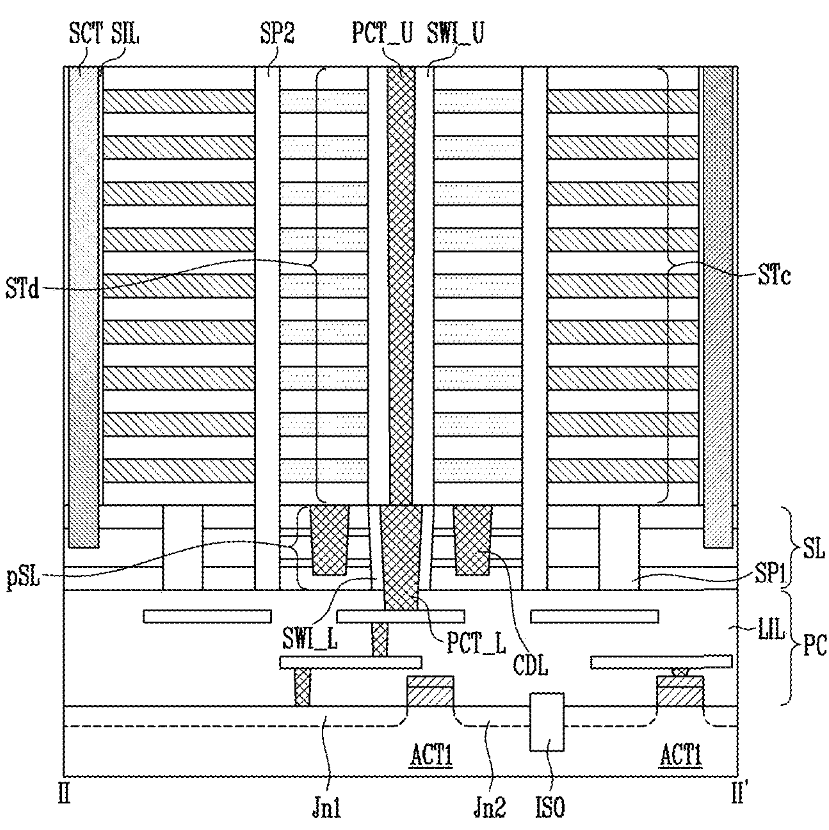
FIG. 4 is a cross-sectional diagram illustrating a semiconductor memory device taken along line II-II' of FIG. 2.

FIG. 4 is a cross-sectional diagram illustrating the semiconductor memory device taken along line II-II' of FIG. 2.

Except for components to be described below, the remaining components are substantially the same as those of the semiconductor memory device as described above with reference to FIGS. 2 and 3.

Referring to FIG. 4, a semiconductor memory device according to an embodiment of the present disclosure may include a slit SI which passes through the cell stack STc, the first support SP1 which passes through the source stack SL, and the second support SP2 which is arranged between the cell stack STc and the dummy stack STd.

The slit SI may be filled with a source contact structure SCT. The source contact structure SCT may be spaced apart from the cell stack STc by a slit insulating layer SIL which is formed on a sidewall of the slit SI. The slit insulating layer SIL may be penetrated by the source contact structure SCT. The source contact structure SCT may extend to be connected to the source stack SL. The source contact structure SCT may include a single conductive material, or two or more types of conductive materials. The conductive material for the source contact structure SCT may include a doped silicon layer, a metal layer, or a metal silicide layer. The conductive material for the source contact structure SCT may further include a barrier layer.

The first support SP1 may pass through the source stack SL. The second support SP2 may be arranged between the cell stack STc and the dummy stack STd. The cell stack STc and the dummy stack STd may be separated from each other by the second support SP2. The second support SP2 may be arranged between the source stack SL under the cell stack STc and the preliminary source stack pSL under the dummy stack STd. The source stack SL and the preliminary source stack pSL may be separated from each other by the second support SP2. The second support SP2 may block an etching material from being introduced into a region where the lower peripheral contact plug PCT_L is arranged during the manufacturing processes of the semiconductor memory device.

FIGS. 5A, 5B, 5C, 5D, 5E, 5F and 5G are cross-sectional views illustrating a method of manufacturing a semiconductor memory device according to an embodiment of the present disclosure.

Figure 5A:
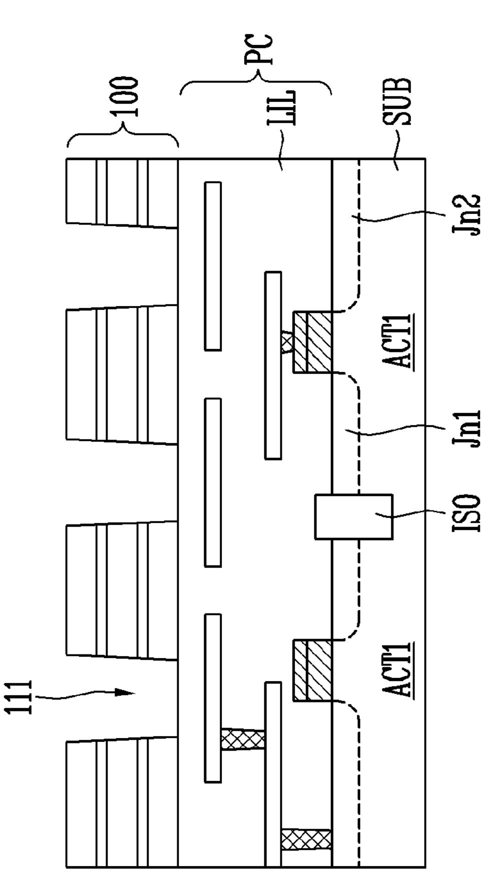
Figure 5A:
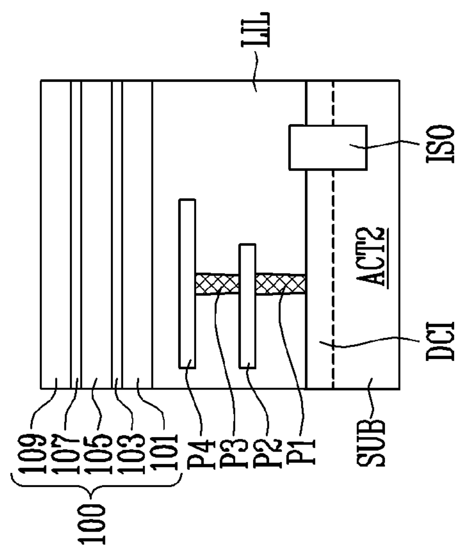

Referring to FIG. 5A, the peripheral circuit structure PC and the first to fourth patterns P1 to P4 may be formed on the substrate SUB which includes the active regions ACT1 and ACT2 which are divided by the isolation layers ISO. The peripheral circuit structure PC and the first to fourth patterns P1 to P4 may be covered by the lower insulation structure LIL.

The active regions ACT1 and ACT2 may include a first active region ACT1 and a second active region ACT2. The second active region ACT2 may include a discharge impurity region DCI and the first active region ACT1 may include junctions Jn1 and Jn2.

The isolation layers ISO, the active regions ACT1 and ACT2, the discharge impurity region DCI, the junctions Jn1 and Jn2, and the peripheral circuit structure PC, and the lower insulation structure LIL have been described above in detail with reference to FIG. 3. Thus, repeated descriptions thereof will be omitted.

The first to fourth patterns P1 to P4 may include a conductive material and be stacked in a sequential manner over the discharge impurity region DCI. The first pattern P1 which is arranged on the lowermost layer of the first to fourth patterns P1 to P4 may directly contact the discharge impurity region DCI.

A preliminary source stack 100 may be formed over the lower insulation structure LIL. The preliminary source stack 100 may include a first source layer 101, a preliminary second source layer 105, and a third source layer 109 which are sequentially stacked on top of each other. Before the preliminary second source layer 105 is deposited onto the first source layer 101, a first protective layer 103 may be formed on the first source layer 101. Before the third source layer 109 is formed on the preliminary second source layer 105, a second protective layer 107 may be formed on the preliminary second source layer 105.

The first source layer 101 may include a doped semiconductor layer which includes conductive impurities. For example, the first source layer 101 may be an n-type doped silicon layer. The preliminary second source layer 105 may include a material which has a different etch rate from the first protective layer 103 and the second protective layer 107. The first protective layer 103 and the second protective layer 107 may include materials which have different etch rates from the first source layer 101 and the third source layer 109. For example, the preliminary second source layer 105 may include an undoped silicon layer, and each of the first protective layer 103 and the second protective layer 107 may include an oxide layer. The third source layer 109 may include a semiconductor layer. For example, the third source layer 109 may include a doped silicon layer or an undoped silicon layer.

Subsequently, a first trench 111 may be formed through the preliminary source stack 100 which does not overlap the discharge impurity region DCI.

Figure 5B:
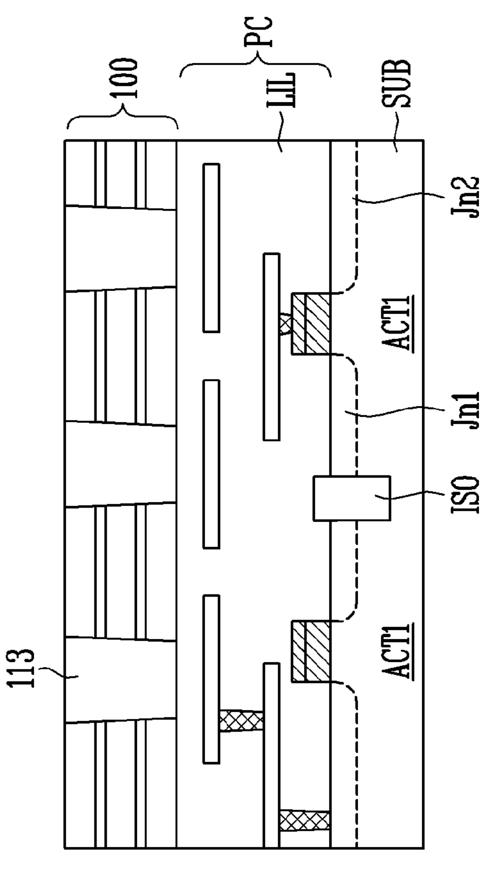
Figure 5B:
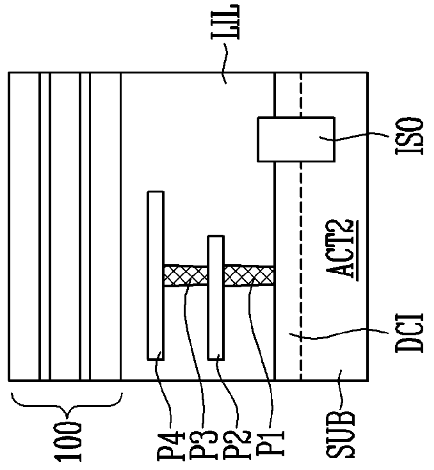

Referring to FIG. 5B, a lower sidewall insulating layer 113 may be formed by filling the first trench 111.

Figure 5C:
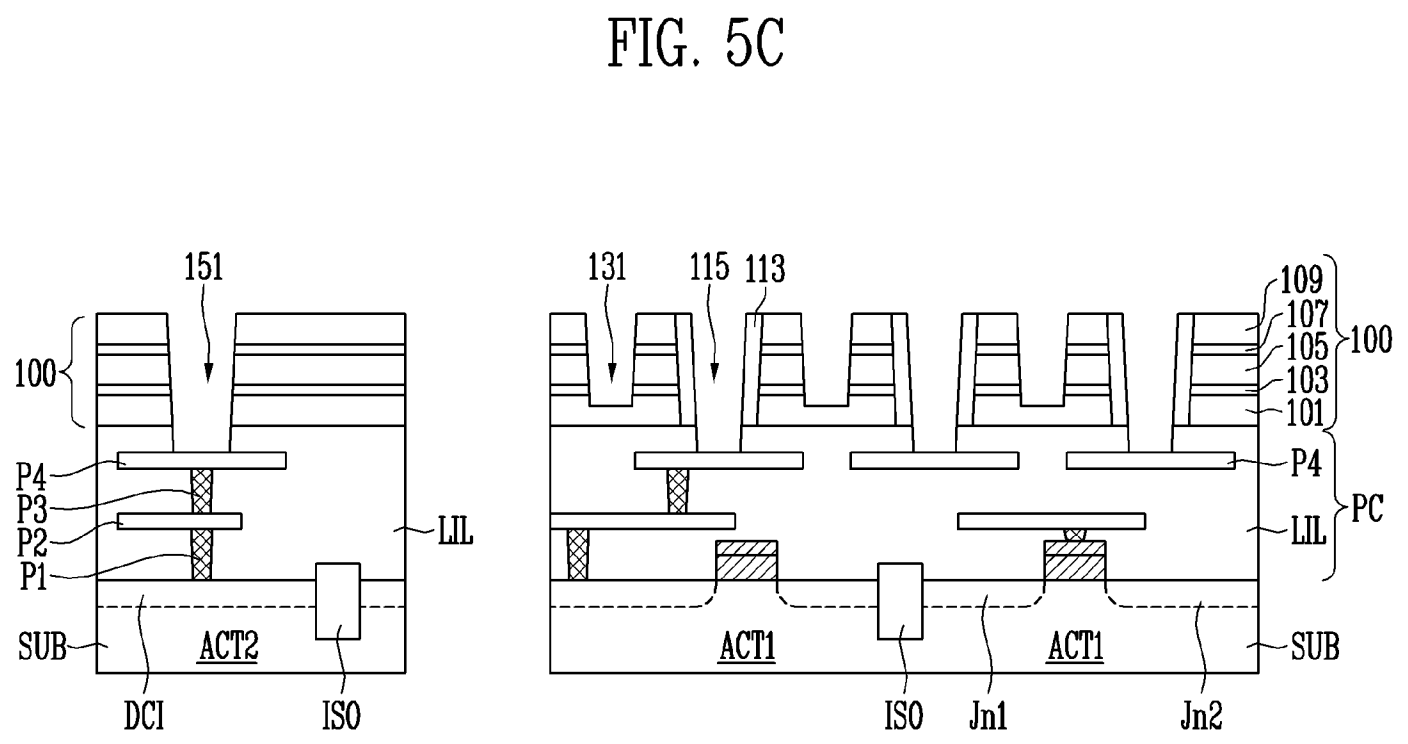

Referring to FIG. 5C, a second trench 115 may pass through the lower sidewall insulating layer 113, a third trench 131 may pass through a portion of the preliminary source stack 100, and an opening 151 may pass through the preliminary source stack 100 which overlaps the discharge impurity region DCI. The second trench 115, the third trench 131, and the opening 151 may be formed at the same time.

The second trench 115 may pass through the lower sidewall insulating layer 113 and extend into the lower insulation structure LIL. The second trench 115 may expose the fourth pattern P4 which is arranged at the top layer of the first to fourth patterns P1 to P4.

The third trench 131 may be spaced apart from the lower sidewall insulating layer 113 and the opening 151.

The opening 151 may pass through the preliminary source stack 100 which overlaps the discharge impurity region DCI, and may extend into the lower insulation structure LIL. The opening 151 may expose the fourth pattern P4 which is arranged at the top layer of the first to fourth patterns P1 to P4.

The third trench 131 may have a smaller width than the opening 151. A length at which the third trench 131 passes through the preliminary source stack 100 may be smaller than a length at which the opening 151 passes through the preliminary source stack 100.

Figure 5D:
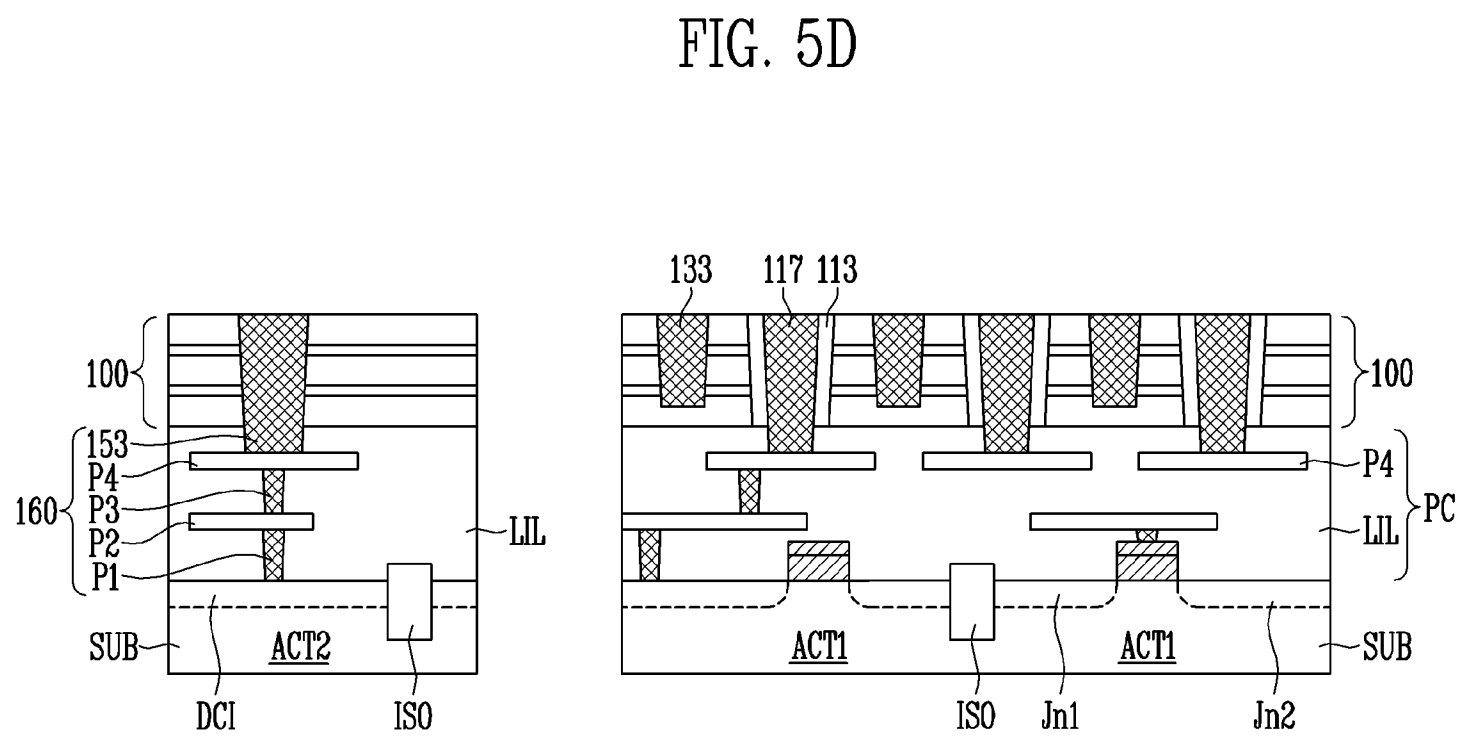

Referring to FIG. 5D, a conductive layer may be formed over the preliminary source stack 100 to fill the second trench 115, the third trench 131, and the opening 151. A planarizing process may be performed to expose the preliminary source stack 100. As a result, a lower peripheral contact plug 117 which fills the second trench 115 and directly contacts the fourth pattern P4 may be formed. A charge dispersion layer 133 may be formed by filling the third trench 131. A fifth pattern 153 which fills the opening 151 and directly contacts the fourth pattern P4 may be formed. The first to fourth patterns P1 to P4 and the fifth pattern 153 may form a conductive contact plug 160 which is connected to the discharge impurity region DCI.

The planarizing process may include a chemical mechanical polishing (CMP) process. The planarizing process may be performed to remove the conductive layer outside the second trench 115, the third trench 131, and the opening 151.

Figure 5E:
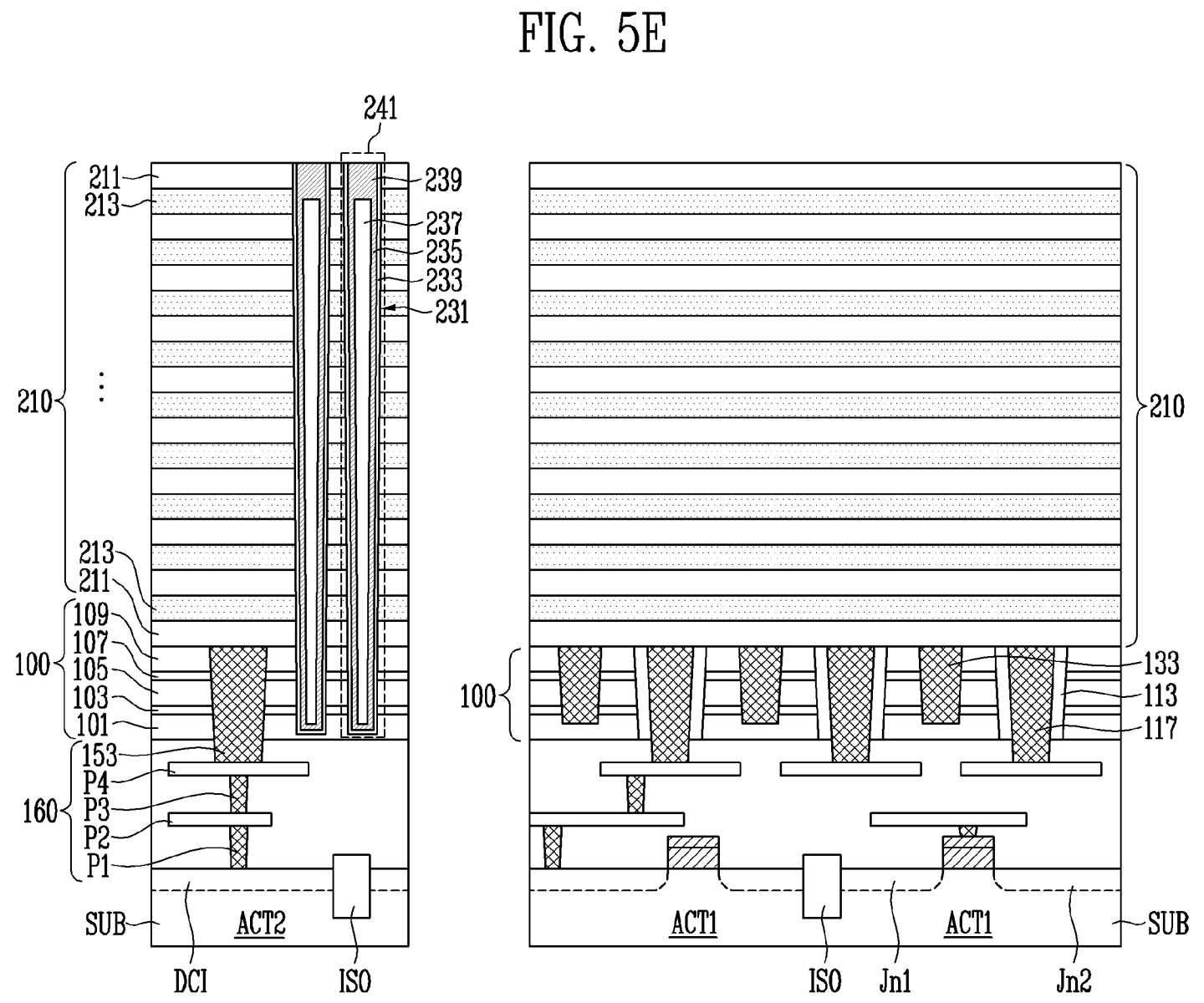

Referring to FIG. 5E, a preliminary stack 210 may be formed over the preliminary source stack 100. The preliminary stack 210 may include first material layers 211 and second material layers 213 which are staked alternately with each other. The first material layers 211 and the second material layers 213 may extend to overlap the conductive contact plug 160.

The first material layers 211 may include a different material from the second material layers 213. According to an embodiment, the first material layers 211 may include an insulating material, and the second material layers 213 may include a sacrificial insulating material which includes a different etch rate from the first material layers 211. For example, each of the first material layers 211 may include a silicon oxide, and each of the second material layers 213 may include a silicon nitride.

Subsequently, a channel hole 231 may extend into the preliminary stack 210. The channel hole 231 may be arranged not to overlap the conductive contact plug 160. The channel hole 231 may pass through the preliminary stack 210. The channel hole 231 may pass through the third source layer 109, the second protective layer 107, the preliminary second source layer 105, and the first protective layer 103 of the preliminary source stack 100. The channel hole 231 may extend into the first source layer 101.

Subsequently, a memory layer 233 may be formed on the surface of the channel hole 231. The memory layer 233 may include a tunnel insulating layer, a data storage layer, and a blocking insulating layer.

A channel layer 235 may be formed on the surface of the memory layer 233, and a central area of the channel hole 231 may be opened by the channel layer 235. The opened central area of the channel hole 231 may be filled with a core insulating layer 237. The channel layer 235 may include a silicon layer. The core insulating layer 237 may include oxide.

The memory layer 233, the channel layer 235, the core insulating layer 237, and a capping pattern 239 may be defined as a cell plug 241.

Figure 5F:
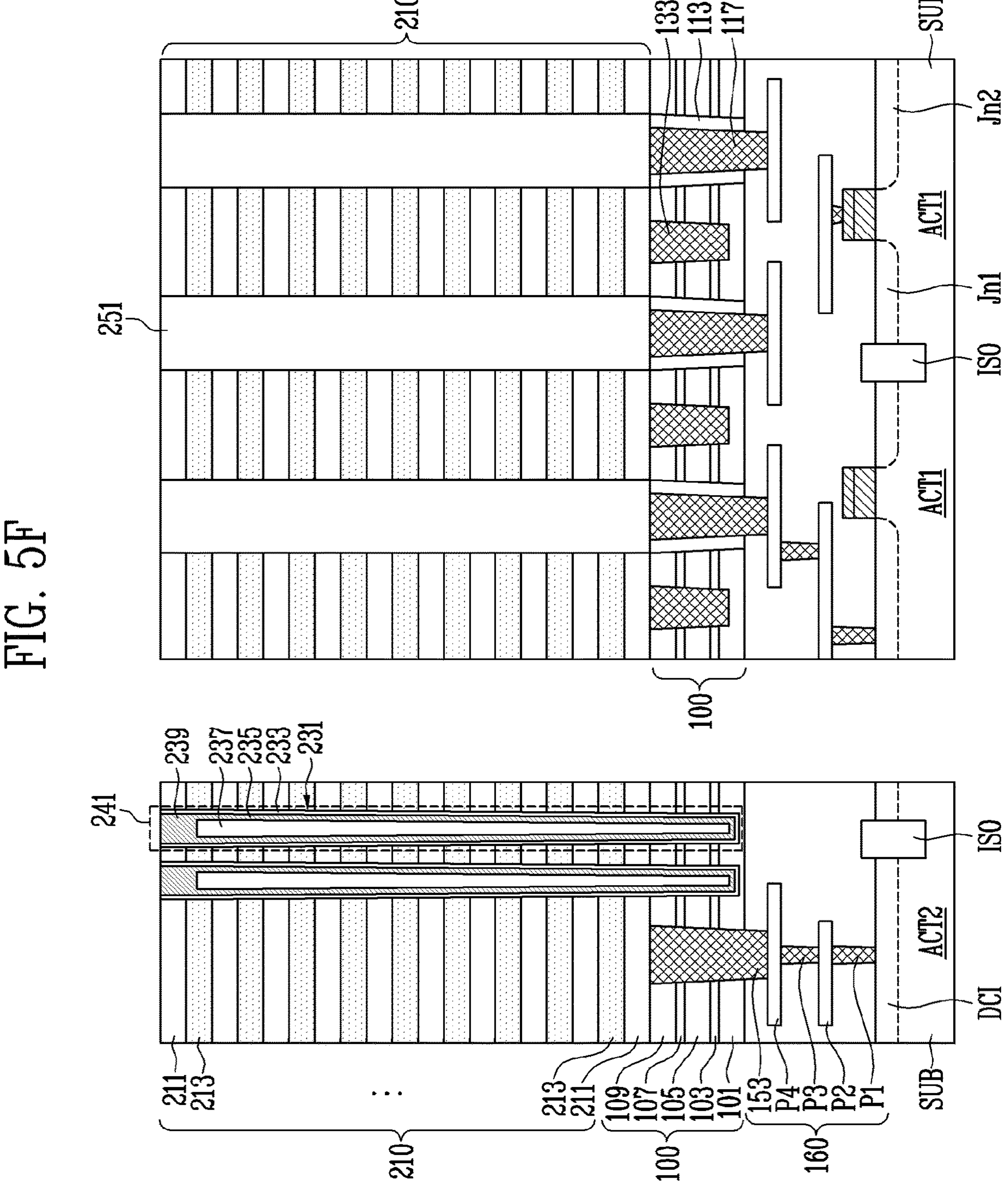

Referring to FIG. 5F, an upper sidewall insulating layer 251 which passes through the preliminary stack 210 and overlaps the lower sidewall insulating layer 113 may be formed. The upper sidewall insulating layer 251 may include the same material as the lower sidewall insulating layer 113.

Referring to FIGS. 5F and 5G, an upper peripheral contact plug 253 may pass through the upper sidewall insulating layer 251.

Subsequently, a slit (corresponding to the slit SI as shown in FIGS. 2 and 4) may pass through the preliminary stack 210. The slit may be formed so as not to overlap the conductive contact plug 160. The slit may be arranged adjacent to the channel layer 235. While an etch process to form the slit is performed, the third source layer 109 of the preliminary source stack 100 may serve as an etch stop layer.

Subsequently, a portion of each of the second material layers 213 which surround the cell plug 241 may be removed through the slit. Regions from which the second material layers 213 are removed may be filled with third material layers 215. As a result, a cell stack 230 (corresponding to STc in FIGS. 3 and 4) which overlaps the preliminary source stack 100 and includes the first material layers 211 and the third material layers 215 stacked alternately with each other may be formed.

Each of the third material layers 215 may include at least one of a doped silicon layer, a metal silicide layer, and a metal layer. Each of the third material layers 215 may further include a barrier layer such as a titanium nitride layer, a tungsten nitride layer, or a tantalum nitride layer.

The first material layers 211 and the second material layers 213 which do not overlap the conductive contact plug 160 may remain as a dummy stack (corresponding to STd in FIGS. 3 and 4), include an insulating material, and block introduction of a conductive material.

Subsequently, a slit insulating layer (corresponding to SIL in FIG. 4) may be formed on a sidewall of the slit to expose a bottom surface of the slit. The preliminary source stack 100 may be exposed through the bottom surface of the slit.

The slit may extend to expose the preliminary second source layer 105 to thereby remove the preliminary second source layer 105. A portion of the memory layer 233 may be removed through a region from which the preliminary second source layer 105 is removed. While the preliminary second source layer 105 is removed, the first protective layer 103 and the second protective layer 107 may prevent loss of the third source layer 109 and the first source layer 101. The first protective layer 103 and the second protective layer 107 may be removed while the memory layer 233 is removed.

As the preliminary second source layer 105, the portion of the memory layer 233, the first protective layer 103, and the second protective layer 107 are removed, a horizontal space may be opened between the third source layer 109 and the first source layer 101.

The horizontal space may be filled with a second source layer 105'. The second source layer 105' may contact a sidewall of the channel layer 235, the first source layer 101, and the third source layer 109. The second source layer 105' may be formed by chemical vapor deposition (CVD), or by a growth method using each of the channel layer 235, the first source layer 101, and the third source layer 109 as a seed layer. The second source layer 105' may directly contact the conductive contact plug 160. For example, the second source layer 105' may directly contact the fifth pattern 153. The second source layer 105' may include a conductivity type dopant. For example, the second source layer 105' may be an n-type doped silicon layer. The conductivity type dopant in the second source layer 105' may be diffused into the third source layer 109 and the channel layer 235 which contact the second source layer 105' by heat.

A source contact structure (SCT corresponding to FIG. 4) which contacts the second source layer 105' and extends to the slit insulating layer (corresponding to SIL in FIG. 4) may be formed. The source contact structure may include a conductive material.

Figure 6:
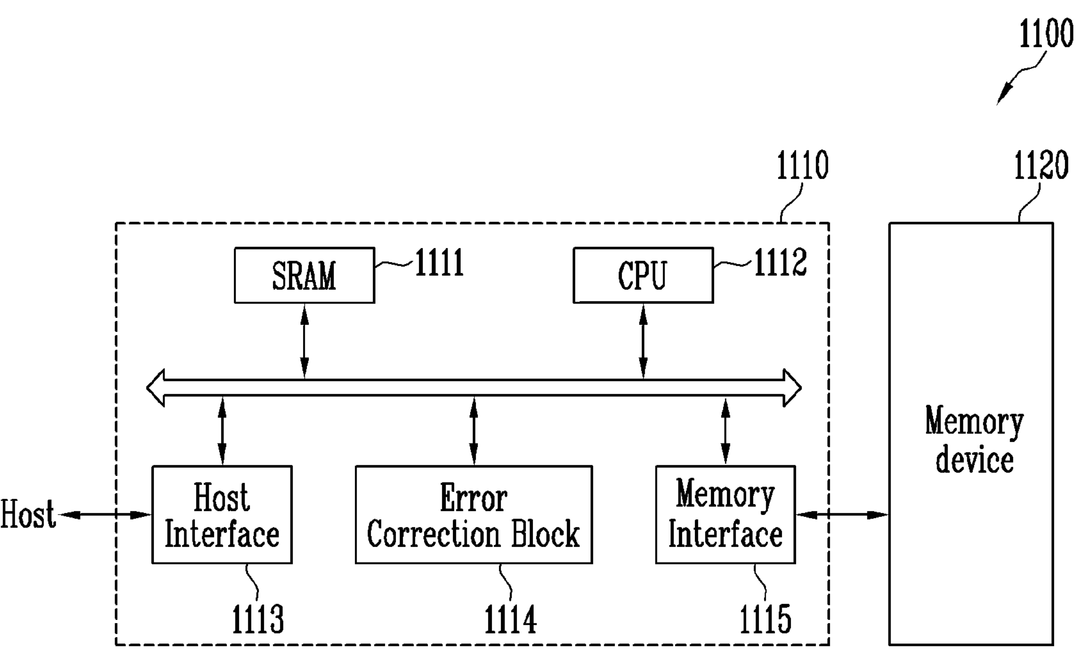
FIG. 6 is a block diagram illustrating the configuration of a memory system according to an embodiment of the present disclosure.

FIG. 6 is a block diagram illustrating the configuration of a memory system 1100 according to an embodiment of the present disclosure.

Referring to FIG. 6, the memory system 1100 may include a memory device 1120 and a memory controller 1110.

The memory device 1120 may be a multi-chip package composed of a plurality of flash memory chips. The memory device 1120 may be a non-volatile memory. In addition, the memory device 1120 may include the configuration described with reference to FIGS. 1 to 4, and may be manufactured by the method described with reference to FIGS. 5A, 5B, 5C, 5D, 5E, 5F and 5G. According to an embodiment, the memory device 1120 may include a substrate; a source stack and a preliminary source stack spaced apart from each other over the substrate; a conductive contact plug passing through the source stack, and a conductive contact plug passing through a portion of the preliminary source stack. Because the memory device 1120 is configured in the same manner as described above, a detailed description thereof is not repeated here.

The memory controller 1110 may be configured to control the memory device 1120 and include static random access memory (SRAM) 1111, a central processing unit (CPU) 1112, a host interface 1113, an error correction block 1114, and a memory interface 1115. The SRAM 1111 may serve as operation memory of the CPU 1112, the CPU 1112 may perform a control operation for data exchange of the memory controller 1110, and the host interface 1113 may include a data exchange protocol of a host accessing the memory system 1100. The error correction block 1114 may detect errors included in the read data from the memory device 1120 and correct the detected errors. The memory interface 1115 may interface between the memory controller 1110 and the memory device 1120. The memory controller 1110 may further include a read-only memory (ROM) which stores code data to interface with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of the interface protocols including Universal Serial Bus (USB), MultiMedia Card (MMC), Peripheral Component Interconnection-Express (PCI-E), Serial Advanced Technology Attachment (SATA), Parallel Advanced Technology Attachment (PATA), Small Computer System Interface (SCSI), Enhanced Small Disk Interface (ESDI), and Integrated Drive Electronics (IDE).

Figure 7:
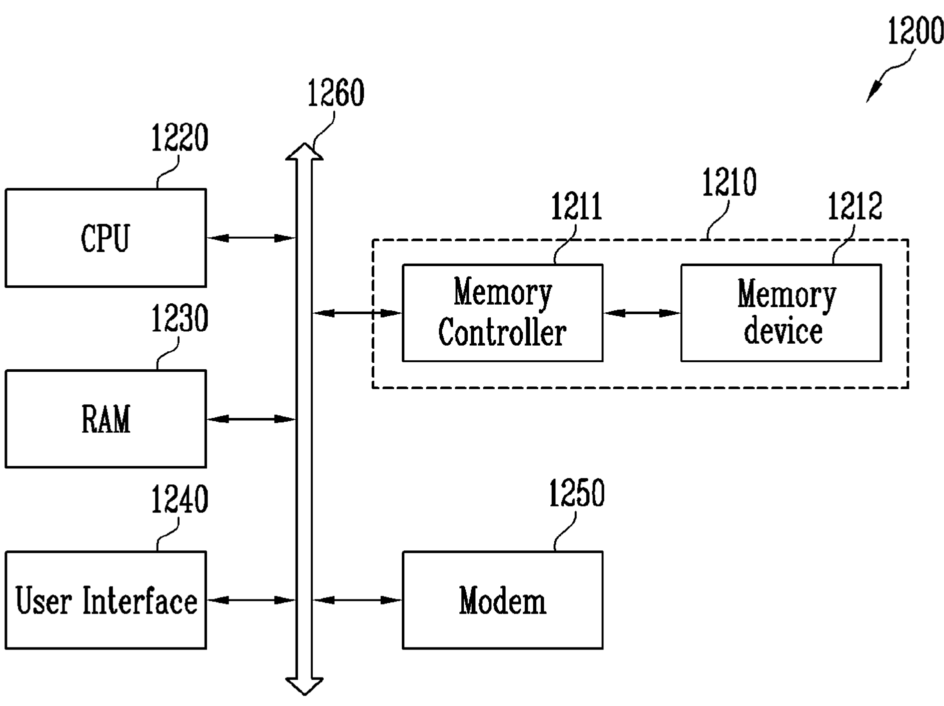
FIG. 7 is a block diagram illustrating the configuration of a computing system according to an embodiment of the present disclosure.

FIG. 7 is a block diagram illustrating the configuration of a computing system 1200 according to an embodiment of the present disclosure.

Referring to FIG. 7, the computing system 1200 in accordance with an embodiment of the present disclosure may include a CPU 1220, random access memory (RAM) 1230, a user interface 1240, a modem 1250, and a memory system 1210 that are electrically coupled to a system bus 1260. In addition, when the computing system 1200 is a mobile device, a battery for supplying an operating voltage to the computing system 1200 may be further included, and an application chipset, an image processor, mobile DRAM, and the like may be further included.

The memory system 1210 may include a memory device 1212 and a memory controller 1211.

The memory device 1212 and the memory controller 1211 may be configured in the same manner as the memory device 1120 and the memory controller 1110 as described above with reference to FIG. 6.

According to the present disclosure, a charge dispersion layer may be spaced apart from a conductive contact plug to disperse charges accumulated in an upper part of a source stack into the entire source stack, thereby reducing resistance, so that operational reliability may be improved.

It will be apparent to those skilled in the art that various modifications can be made to the above-described embodiments of the present invention without departing from the spirit or scope of the invention. Thus, it is intended that the present invention cover all such modifications provided they come within the scope of the appended claims and their equivalents.

What is claimed is:

1. A semiconductor memory device, comprising:
- a source stack and a preliminary source stack spaced apart from each other;
- a conductive contact plug passing through the source stack;
- a charge dispersion layer passing through a portion of the preliminary source stack;
- a dummy stack including dummy insulating layers and sacrificial insulating layers stacked alternately with each other over the preliminary source stack;
- a lower peripheral contact plug passing through the preliminary source stack; and
- an upper peripheral contact plug passing through the dummy stack and overlapping the lower peripheral contact plug.

2. The semiconductor memory device of claim 1,
- wherein the conductive contact plug passes through a bottom surface of the source stack, and
- a portion of the preliminary source stack extends along a bottom surface of the charge dispersion layer.

3. The semiconductor memory device of claim 1,
- wherein a width of the charge dispersion layer is less than a width of the conductive contact plug.

4. The semiconductor memory device of claim 1, further comprising a support passing through at least one of the preliminary source stack and the dummy stack.

5. The semiconductor memory device of claim 1,
- wherein the preliminary source stack includes a first source layer and a second source layer on the first source layer, and
- wherein the charge dispersion layer passes through a portion of the first source layer.

6. The semiconductor memory device of claim 5, wherein the charge dispersion layer comprises:
- a bottom surface contacting the first source layer; and
- a sidewall contacting the second source layer.

7. The semiconductor memory device of claim 1, further comprising:
- isolation layers arranged in a substrate;
- a peripheral circuit structure including a transistor arranged over a first active area overlapped by the preliminary source stack, among active regions of the substrate separated from each other by the isolation layers; and a lower insulation structure covering the peripheral circuit structure between the substrate and the preliminary source stack.

8. The semiconductor memory device of claim 1, further comprising:

isolation layers arranged in a substrate;

a discharge impurity region defined in a second active region overlapped by the conductive contact plug among active regions of the substrate separated from each other by the isolation layers, the discharge impurity region contacting the conductive contact plug; and a lower insulation structure arranged between the substrate and the source stack and penetrated by the conductive contact plug.

9. The semiconductor memory device of claim 1, further comprising:

a cell stack including cell interlayer insulating layers and conductive patterns stacked alternately with each other over the source stack; and a channel structure passing through the cell stack and coupled to the source stack.

10. The semiconductor memory device of claim 9, wherein the channel structure extends into the source stack and has a sidewall directly contacting the source stack.

11. The semiconductor memory device of claim 1, wherein the conductive contact plug is spaced apart from the charge dispersion layer.

* * * * *